United States Patent [19]
Brown

[11] Patent Number: 5,304,919
[45] Date of Patent: Apr. 19, 1994

[54] ELECTRONIC CONSTANT CURRENT AND CURRENT PULSE SIGNAL GENERATOR FOR NUCLEAR INSTRUMENTATION TESTING

[75] Inventor: Roger A. Brown, Amsterdam, N.Y.

[73] Assignee: The United States of America as represented by the Department of Energy, Washington, D.C.

[21] Appl. No.: 897,409

[22] Filed: Jun. 12, 1992

[51] Int. Cl.$^5$ .................. G01R 35/00; H03K 3/00
[52] U.S. Cl. ...................... 324/74; 324/604; 324/602; 307/106
[58] Field of Search .......... 324/74, 601, 603, 604; 364/571.01, 802; 331/64, 65, 241 P, 241 S; 315/111, 129; 328/261, 264, 270; 307/1, 2, 4, 106, 107

[56] References Cited
U.S. PATENT DOCUMENTS

| | | |
|---|---|---|
| 3,681,656 | 8/1972 | Mitchell .................. 307/107 X |
| 3,805,184 | 4/1974 | Visioli, Jr. et al. . |
| 3,914,711 | 10/1975 | Carlson et al. . |
| 3,927,399 | 12/1975 | Fuzzell . |
| 3,946,336 | 3/1976 | Froom et al. . |
| 4,190,808 | 2/1980 | Fajen . |
| 4,238,709 | 12/1980 | Wallace . |
| 4,473,875 | 9/1984 | Parsons et al. .................. 307/106 X |
| 4,614,940 | 9/1986 | Jaeckle . |
| 4,782,242 | 11/1988 | Kovacs . |
| 5,547,724 | 10/1985 | Beazley et al. .................. 324/603 X |

Primary Examiner—Gerard R. Strecker
Assistant Examiner—Diep Do
Attorney, Agent, or Firm—Frederick C. Williams; William R. Moser; Richard E. Constant

[57] ABSTRACT

Circuitry for testing the ability of an intermediate range nuclear instrument to detect and measure a constant current and a periodic current pulse. The invention simulates the resistance and capacitance of the signal connection of a nuclear instrument ion chamber detector and interconnecting cable. An LED flasher/oscillator illuminates an LED at a periodic rate established by a timing capacitor and circuitry internal to the flasher/oscillator. When the LED is on, a periodic current pulse is applied to the instrument. When the LED is off, a constant current is applied. An inductor opposes battery current flow when the LED is on.

8 Claims, 1 Drawing Sheet

5,304,919

ELECTRONIC CONSTANT CURRENT AND CURRENT PULSE SIGNAL GENERATOR FOR NUCLEAR INSTRUMENTATION TESTING

The Government has rights in this invention pursuant to Contract No. DE-AC12-76-SN00052 awarded by the U.S. Department of Energy.

BACKGROUND OF THE INVENTION a. Field of the Invention

The present invention relates generally to electronic test circuitry and, more particularly, to circuitry for testing the ability of an intermediate range nuclear instrument to detect and measure a constant current and a periodic current.

b. Description of the Prior Art

Occasionally, malfunctions occur in the nuclear instruments used to measure ion chamber current. These nuclear instruments, in this case termed "intermediate range nuclear instrumentation", are essentially comprised of an input circuit, a current level measuring circuit and meter, a rate of change of level measuring circuit and meter, and internal test circuits. This current, at levels of between $10^{-11}$ amperes and $10^{-2}$ amperes is generated by the ion chamber and is proportional to the neutron flux (power level) in the nuclear reactor. Since multiple channels of instrumentation are used, the malfunctioning instrument can be removed and replaced with a spare known to be operational. The malfunctioning instrument is then repaired. Upon completion of repairs, test circuits internal to the instrument are used to check the instrument and confirm if the repair actions were successful.

In many instances, external current sources are not readily available to confirm proper instrument operation starting at the instrument's signal input connector. Because the internal test circuits do not check the instrument from its signal input under system conditions, an input fault may go undetected until the instrument is re-installed in the system.

Typical of the prior art is U.S. Pat. No. 4,782,242 to Kovacs which discloses a switching circuit for generating high voltage pulses utilizing an inductive coil. Some named uses for that switching circuit include the ignition of internal combustion engines, ignition of flash tubes, and in traffic control systems.

A solid state monitoring system is disclosed in U.S. Pat. No. 3,927,399 to Fuzzell which provides an operator of a machine with a sensible indication when the condition being monitored changes from one side of a predetermined level of operation to the other side of that level. In this known instance, the system utilizes a solid state integrated circuit timer for each critical level of condition to be detected, the timer being connected for astable oscillation and triggered into oscillation when the charge of a timing capacitor rises to the threshold level of the timer.

Oscillation of the timer then energizes an indicator, for example, a light-emitting diode, to provide a sensible indication to the operator.

However, in no known instance is there available a simple and readily usable test circuit for testing the ability of an instrument to detect and measure both a constant current and a periodic current pulse.

SUMMARY OF THE INVENTION

It was with knowledge of the prior art as just described that the present invention was conceived and has now been reduced to practice. To this end, circuitry is disclosed for testing the ability of an intermediate range nuclear instrument to detect and measure a constant current and a periodic current pulse. The invention simulates the resistance and capacitance of the signal connection of a ion chamber detector and interconnecting cable. An LED flasher/oscillator illuminates an LED at a periodic rate established by a timing capacitor and circuitry internal to the flasher/oscillator. When the LED is on, a periodic current pulse is applied to the instrument. When the LED is off, a constant current is applied. An inductor opposes battery current flow when the LED is on.

The invention requires minimal current from the battery in order to function. Indeed, continuous operation of the invention for one year utilizing a size "D" dry cell (1.5 volts) has been confirmed. Accordingly, no on-off switch or other variable controls are needed. Furthermore, the LED can also be utilized to provide additional functions. For example, it can provide a visible indication as to when the variable current output is taking place. Also, it can provide a visible indication that there exists sufficient battery capacity to power the circuit of the invention. When the LED no longer illuminates periodically, it is apparent that the battery should be replaced.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

BRIEF DESCRIPTION OF THE DRAWING

The single FIGURE presents, in schematic form, electronic test circuitry in accordance with the principles of the present invention.

DESCRIPTION OF THE PREFERRED EMBODIMENT

Figure 1:
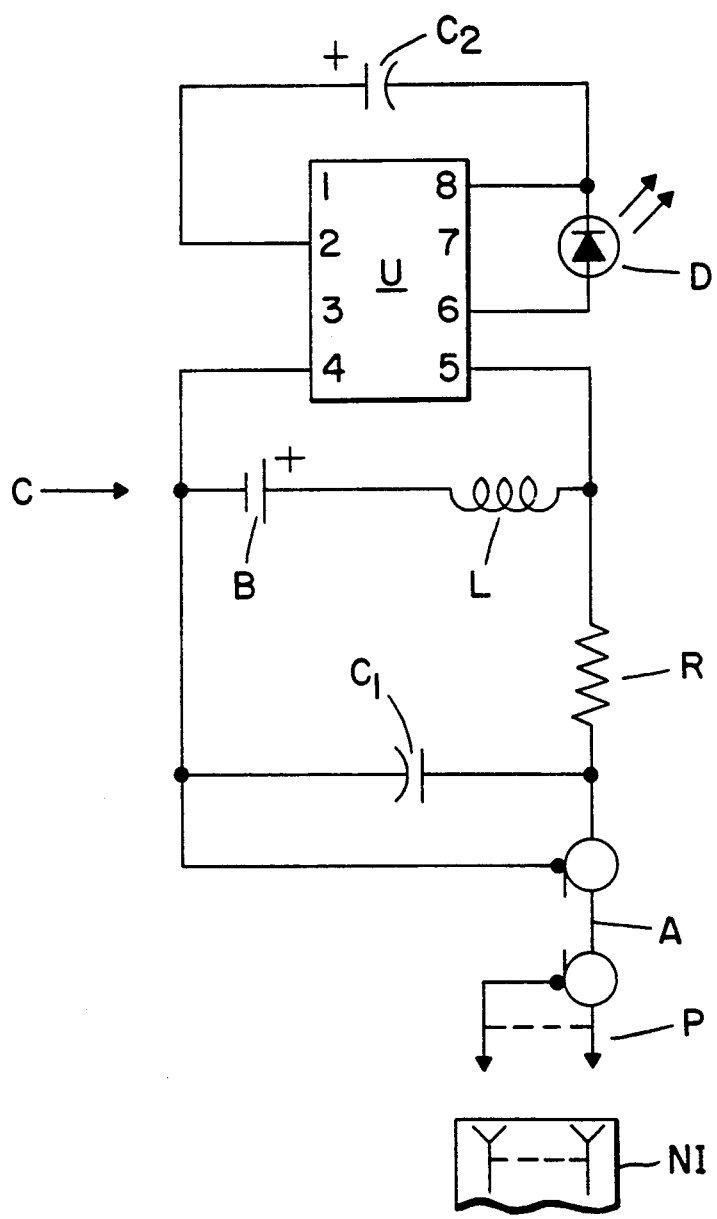

Turn now to the drawing illustrating an electronic circuit (C) in schematic form. Circuit (C) provides a simple means of checking an intermediate range nuclear instrument (NI) from its signal input connector, by testing the ability of the instrument to detect and measure a constant current and a periodic current pulse. The invention provides a current output which is controlled by a source of EMF, battery (B), and the ohmic value of a resistor (R), according to Ohms Law. Battery (B) also powers an integrated circuit (U). A capacitor (C1) simulates the actual capacitance that the intermediate range nuclear instrument detector and cabling would normally exhibit when connected to the instrument. A connector (P) and cable (A) couple the current signal from the invention to the instrument. Integrated circuit (U) is a light emitting diode (LED) flasher/oscillator which lights an LED (D) at a periodic rate established by a timing capacitor (C₂) and components internal to the integrated circuit (U).

A particularly unique concept of the invention is the provision of an inductor (L) in combination with the integrated circuit (U). The inductor (L) is electrically connected in series with the battery (B) which then is electrically connected to the integrated circuit (U). The inductor (L) opposes the change in current from battery (B) when the LED (D) lights, causing a changing current to be supplied to the instrument (NI) connected to the invention via cable (A) and connector (P). After LED (D) turns off, the electric current output returns to the value controlled by battery (B) and resistor (R).

Thus, the intermediate range nuclear instrument (NI) is supplied with a constant electric current when LED (D) is off and a changing electric current when LED (D) is illuminated. The instrument's level measuring circuit will, therefore, detect and measure the value of the constant electric current while LED (D) is off and, the instrument's rate measuring circuit will detect and respond to the rate of change of the electric current while LED (D) is illuminated.

It will be appreciated that the circuitry of the invention can be readily connected, via connector (P), to the instrument (NI) to be checked, then just as readily be disconnected from the instrument. No costly switches or variable controls are required. Furthermore, an inexpensive battery (B) is utilized whose energy level is constantly under scrutiny as determined by the periodic illumination of the LED (D). When the LED (D) no longer illuminates periodically, it is clear to the user that the power output of the battery has diminished to a level below that necessary to operate the invention and should be replaced.

In a typical construction, the output resistance of a nuclear instrument ion chamber detector is approximately $10^{10}$ ohms. Utilizing a resistance (R) of that approximate value simulates the ion chamber detector output resistance when the test circuitry is connected to the nuclear instrument (NI). The output capacitance of a nuclear instrument ion chamber detector is approximately 1300 picofarads, and includes both detector and coaxial cable capacitance. Capacitor (C1) is selected to be substantially equal to that value of capacitance, when the test circuitry is connected to the nuclear instrument (NI).

While a preferred embodiment of the invention has been disclosed in detail, it should be understood by those skilled in the art that various other modifications may be made to the illustrated embodiments without departing from the scope of the invention as described in the specification and defined in the appended claims.

I claim:

1. Electronic test circuitry for simulating the output of a nuclear detector device, which device produces a relatively constant direct current with sharp, short duration, unidirectional direct current pulses superimposed thereon, said simulated output to be directed to the signal input of a nuclear electronic instrument to be tested, said circuitry comprising:
   a source of direct current electromotive force connected in series with an inductor, the combination comprising a first circuit element which produces a current when a closed circuit is completed in such a manner that said inductor resists change in the current through the source of direct current electromotive force;
   a second circuit element connected in parallel with said first circuit element, said first circuit element and said second circuit element so connected comprising collectively a third circuit element,
   said second circuit element comprising a flasher circuit means for producing sharp, short duration, unidirectional pulses of current with fixed period of time between pulses, whereby the inductor in the first circuit element resists changes in the direct current drawn through the direct current electromotive force so that the flasher circuit means produces sharp, short duration, unidirectional pulses of current, not substantially drawn through the source of direct current electromotive force because of the resistance of the inductor to change in the current, when a closed circuit is completed;
   a resistance, simulating the internal resistance of said nuclear detector device, connected in series with said third circuit element, the combination comprising a fourth circuit element;
   a capacitance simulating the internal capacitance of said nuclear detector device, connected in parallel with said fourth circuit element, the combination comprising a fifth circuit element; and
   a means of connecting the terminals of said fifth circuit element by cable to said nuclear electronic instrument.

2. Electronic test circuitry as set forth in claim 1 wherein said circuit means for producing sharp, short duration, unidirectional pulses of current additionally comprises
   indicator means responsive to operation of said flasher circuit means whereby application of a pulsed current to the nuclear electronic instrument to be tested results in the periodic operation of said indicator means.

3. Electronic test circuitry as set forth in claim 2:
   wherein said indicator means includes an LED which is alternately energized and deenergized through operation of said flasher circuit means.

4. Electronic test circuitry as set forth in claim 1:
   wherein said flasher circuit means comprises:
   an integrated circuit flasher/oscillator;
   a timing capacitor connected across terminals of said integrated circuit flasher/oscillator; and
   an indicator means connected across terminals of said integrated circuit flasher oscillator;
   whereby during periodic operation of said flasher circuit means said inductor in said first circuit element opposes change in current through the source of direct current electromotive force whereby a pulsed current passes through the nuclear electronic instrument to be tested.

5. Electronic test circuitry as set forth in clam 4:
   wherein said indicator means is an LED connected across terminals of said integrated circuit flasher/oscillator and connected at one of said terminals to a first end of said timing capacitor, the second end of said timing capacitor being connected to another one of said terminals, said LED being energized upon discharge of said timing capacitor, thereby creating and simultaneously indicating a current pulse to the nuclear electronic instrument to be tested.

6. Electronic test circuitry as set forth in claim 1 wherein:
   said indicator means connected to said flasher circuit means operates in such a way that a change in the period of time between pulses indicates a change in the power available from said source of direct current electromotive force wherein a change in said period of time beyond a preset level indicates need for a replacement of the source of direct current electromotive force.

7. Electronic test circuitry as set forth in claim 4: wherein said indicator means is an LED electrically connected to terminals of said integrated circuit flasher/oscillator.

8. Electronic test circuitry as set forth in claim 1: wherein said source of direct current electromotive force is a battery.

* * * * *